(12) United States Patent
Liu et al.

(10) Patent No.: US 8,560,278 B2
(45) Date of Patent: Oct. 15, 2013

(54) MRI GRADIENT COIL

(75) Inventors: Zhenyu Liu, Freiburg (DE); Feng Jia, Freiburg (DE); Jan Gerrit Korvink, Karlsruhe (DE)

(73) Assignee: Albert-Ludwigs-Universitaet Freiburg, Freiburg (DE)

( * ) Notice: Subject to any disclaimer, the term of this patent is extended or adjusted under 35 U.S.C. 154(b) by 644 days.

(21) Appl. No.: 12/662,387

(22) Filed: Apr. 14, 2010

(65) Prior Publication Data
US 2010/0268514 A1    Oct. 21, 2010

(30) Foreign Application Priority Data

Apr. 20, 2009   (EP) ..................................... 09158247

(51) Int. Cl.
*G06F 7/60* (2006.01)
*G06F 17/10* (2006.01)

(52) U.S. Cl.
USPC .............................. 703/2; 324/318; 324/322

(58) Field of Classification Search
USPC ...................... 703/2; 324/318, 322
See application file for complete search history.

(56) References Cited

U.S. PATENT DOCUMENTS

2006/0244449 A1 * 11/2006 Muftuler et al. ............... 324/318

OTHER PUBLICATIONS

P.C. Lauterbur, "Image Formation by Induced Local Interactions: Examples of Employing Nuclear Magnetic Resonance", Nature 242, 190491, 1973.
R. Turner, "A target field approach to optimal coil design", J. Phys. D: Appl. Phys. 19 147451, 1986.
R. Turner, "Minimum inductance coils", J. Phys. E: Sci Instrum 21, 948-952, 1988.
R. Turner, "Gradient coil design: A review of methods", Magn. Reson. Imaging 11, 903-920, 1993.
L.K. Forbes and S. Crozier, "Novel Target-Field Method for Designing Shielded Biplanar Shim and Gradient Coils", IEEE Trans. Magn., vol. 40, No. 4, 1929-1938, 2004.
L.K. Forbes, M.A. Brideson and S. Crozier "A target-field method to design circular biplanar coils for asymmetric shim and gradient fields", IEEE Trans. Magn., vol. 41, No. 6, 2134-2144, 2005.
W. Liu, D. Zu, X. Tang and H. Guo, "Target-field method for MRI biplanar gradient coil design", J. Phys. 1):Appl. Phys. 40 4418-4424(7), 2007.

(Continued)

*Primary Examiner* — Saif Alhija
(74) *Attorney, Agent, or Firm* — Paul Vincent

(57) ABSTRACT

A method for designing an electromagnetic gradient coil for magnetic resonance imaging systems. The method includes the steps of: choosing a set of objectives $L_i$, whereby the objectives $L_i$ are combined to one weighted-sum objective function; choosing a design variable $\psi$ for modifying the value of the objectives L; making an initial guess of the value of the design variable $\psi$; simulating the magnetic field in a computational domain with respect to the distribution of the surface current density; carrying out a sensitivity analysis by calculating a sensitivity vector $G=\partial L/\partial \psi$; updating the design variable $\psi$, whereby the value of the design variable $\psi$ is changed in order to decrease the value of the objective L; determining whether convergency is achieved by either determining whether the value of the objective function does not decrease or the whether the Euclidian norm of the sensitivity vector G approximate to zero; and reconstruction of a discretized coil. The simulation of the magnetic field in a computational domain is effected using a least square finite element analysis. The steps are repeated prior to reconstruction of a discretized coil until convergency is achieved. An effective and improved design for irregular surfaces is thereby created.

22 Claims, 6 Drawing Sheets

(56) References Cited

OTHER PUBLICATIONS

M. Engelsberg, Ricardo E De Souza and Carlos M Dias Pazos, "The limitations of a target field approach to coil design" J. Phys. D: Appl. Phys. 21 1062-1066, 1988.

F. Shi and R. Ludiwg, "Magnetic resonance imaging gradient coil design by combining optimization techniques with the finite element method", IEEE Trans. Magn., vol. 34, No. 3, 671-683, 1998.

M. Poole and R. Bowtell, "Novel gradient coils designed using a boundary element method", Concepts Magn. Reson. Part B, 31B:162-175, 2007.

L.Marin, H. Power, R.W. Bowtell, C.C. Sanchez, A.A. Becker, P. Glover, A. Jones, "Boundary element method for an inverse problem in magnetic resonance imaging gradient coils", CMES-Comp. Model. Eng. Sei., 23:149-173, 2008.

G.N. Peeren, "Stream function approach for determining optimal surface currents", J. Comput. Phys., vol. 191, No. 1, 305-321, 2003.

D.C. Liu and J. Noceda, "On the limited memory BFGS method for large scale optimization methods", Mathematical Programming 45, 503-528, 1989.

R. Bowtell, P. Robyr, "Multilayer Gradient Coil Design", J. Magn. Reson., 131, 286-291, 1998.

J.Leggett, S.Crozier, S.Blackband, B.Beck and R.W. Bowtell, "Multilayer transverse gradient coil design", Concepts Magn. Reson. B 16, 38C46 2003.

Pissanetzky, S., "Minimum energy MRI gradient coils of general geometry", Measurement Science and Technology, IOP, Bristol, GB, vol. 3, No. 7, Jul. 1, 1992, pp. 667-673.

Moon, C H.; Park H W.; Cho M H; Lee S Y, "Design of convex-surface gradient coils for a vertical-field open MRI system", Measurement Science & Technology IOP Publishing UK, vol. 11, No. 8, Aug. 2000, N 89-N 90.

Lunin V. P., Maximov V S, "Design of gradient coil system by 3DFEM with implemented simplex optimization method", AIP Conference Proceedings AIP USA, No. 509-B, 2000, pp. 1963-1970.

B. Jiang; "The least squares finite element, method: theory and applications in computational fluid dynamics and electromagnetics", Springer-Verlag, 1998, chapters 5.4 and 14.4.1.

J.M. Jin, "The Finite Element Method in Electromagnetics (2nd Edition)", New York: John Wiley & Sons, 2002, pp. 150-155.

M.P. Bendsoe; O. Sigmund, "Topology Optimization Theory, Methods and Applications", Springer, 2003, pp. 16 to 19.

* cited by examiner

MRI GRADIENT COIL

This application claims Paris Convention priority of EP 09 158 247.8 filed Apr. 20, 2009 the complete disclosure of which is hereby incorporated by reference.

BACKGROUND OF THE INVENTION

The invention relates to a method for designing an electromagnetic gradient coil for magnetic resonance imaging systems comprising:
a. Choosing a set of objectives, whereby the objectives are combined to one weighted-sum objective function,
b. Choosing a design variable for modifying the value of the objectives;
c. Making an initial guess of the value of the design variable,
d. Simulating the magnetic field in a computational domain with respect to the distribution of the surface current density,
e. Carrying out a sensitivity analysis by calculating a sensitivity vector,
f. Updating the design variable whereby the value of the design variable is changed in order to decrease the value of the objective,
g. Determining whether convergency is achieved by either determining whether the value of the objective function does not decrease or the whether the Euclidian norm of the sensitivity vector approximate to zero;
h. Reconstruction of a discretized coil.

A method of this type was disclosed in [2] [3] [4] [5] [6] [7].

Magnetic resonance imaging (MRI) is a relative new technology compared with computed tomography (CT) and the first MR Image was published in 1973[1]. It is primarily a medical imaging technique which most commonly used in radiology to visualize the structure and function of the body. It could provide detailed Images of the body in any plane. MRI provides much greater contrast between the different soft tissues of the body than CT does, making it especially useful in neurological, cardiovascular, and oncological imaging. It uses a powerful magnetic field to align the nuclear magnetization of hydrogen atoms in water in the body. Radio frequency fields are used to systematically alter the alignment of this magnetization, causing the hydrogen nuclei to produce a rotating magnetic field detectable by the scanner. This signal can be manipulated by additional magnetic fields to build up enough information to reconstruct an image of the body.

In an MRI scanner there are three main parts, a static magnetic field, three orthogonal and controllable magnetic gradients, and radio frequency (RE) transmitter and receiver. The magnet is the largest and most expensive component of the scanner which is used to generate the main static magnetic field $B_0$, and the remainders of the scanner are built around it. The straightness of the magnetic lines within the center of the magnet needs to be near-perfect. This is known as homogeneity. Gradient coils are used to spatially encode the positions of protons by varying the magnetic field across the imaging volume. The Larmor frequency will then vary as a function of position in the x, y and z axes respectively. Gradient coils are powered by amplifiers which permit rapid and precise adjustments to their field strength and direction. Typical gradient systems are capable of producing gradients from 20 mT/M to 100 mT/M. The main factors of the gradient coils are the gradient field strength and the switch time. Usually stronger gradients allow for higher resolution, and low inductance of the gradient coil allows the faster switching and faster imaging. The RF transmission system consists of a RF synthesizer, power amplifier and transmitting coil. This is usually built into the body of the scanner. The receiver consists of the coil, pre-amplifier and signal processing system. A variety of coils are available which fit around parts of the body. The design of novel gradient coils which can generate specified magnetic gradients are discussed in the following.

Currently there are two methods commonly used for designing the MRI gradient coil, the analytical method and the numerical optimization method. The differences between these two methods are mainly for the method used to calculate the magnetic field in the region of interest (ROI) with respect to the distribution of the surface current density. For the analytical type method, the magnetic field $B_z$ is calculated using the Blot—Savart law or the series expansion if the current exists on the regular surface, such as planar or cylinder surfaces. The dominated design method for the gradient coil design is the so-called target field method [2] [3] [4] [5] [6] [7]. This method relies on the Fourier transform which is widely used for many integral equations. The ideal value of magnetic field distribution is used with the collation method to interpolate the coefficients matrix for the analytical expression of the magnetic field. The current density value is solved using the inverse of the coefficient matrix and the magnetic value on the collocation points. Because of the analytical characteristic of the target field method, the design of the gradient coil theoretically needs to solve merely one linear algebra equation. This is a big advantage compared with the most of numerical optimization methods in which the design procedure strongly depends on the iteration update, especially 20 years ago that the computer had limited computational performance.

However, the target field method also has unavoidable drawbacks. Firstly, the series expansion of the magnetic field works for the infinite open domain, whereas the gradient coil must locate in the limited domain. Therefore there exists cutoff error when the gradient coil is limited in certain length. Secondly, the special function used for the series expansion merely works properly for the regular surface. For the irregular surface or piece of regular surface (for example, a cylinder surface with a circle hole), there is no straightforward extension for the target field method. Thirdly the inverse of the coefficient matrix is ill-posed. The condition number of the matrix is strongly dependent on the number and position of the collocation points. The small numerical error introduced by the computational procedure may generate significant variation of the gradient coil and then the magnetic field $B_z$ in ROI. In [8], authors mentioned that the best result can be obtained when the target points is imposed along the axis of the solenoid or every close to it. This means that the ROI merely has small dimension along the main magnetic field $B_0$ direction which is contradiction with the design goal of the gradient coil which prefers as larger functional ROI as possible.

Compared with the analytical method, the numerical optimization method [9] [10] [11] has advantages in the case that the computational domain is irregular, or the objective field cannot be expressed directly using the polynomials. The computational domain is a three dimensional domain. The surface where the design variable exists (design domain) should stay inside the computational domain and should surround the ROI.

However, the numerical optimization method also has obvious drawbacks at this moment. There are a couple of the numerical methods can be used to calculate the distribution of the magnetic field, for example, the finite element method, the finite different method, the boundary element method, the method of moments, and the fast multipole method etc. For all of these numerical methods, the computational cost is much expensive than the analytical method. At the same time, the design of novel gradient coil has to be implemented using the numerical iterative type optimization methodology. This is the reasons the analytical method is still the first choice if one can use it.

Object of the present invention to suggest method for coil design based on the target field method which allows an effective and improved design for irregular surfaces and reduction of cutoff errors.

SUMMARY OF THE INVENTION

This object is achieved by using least square finite element analysis to simulate the magnetic field in a computational domain, and by repeating the method steps until convergency is achieved.

In the present invention—the finite element method is used for the topology type optimization of various gradient coils on planar and cylinder surface with multiple objectives. The usage of finite element analysis for magnetic field simulation in an iterative optimization method allows choosing more general objectives than it would be possible with known coil optimization methods. The iterative optimization further allows choosing general initial values, such as zero.

A preferred design variable is the scalar stream function because the scalar stream function can be used to express the surface current density by using the Lagrange element with single degrees of freedom on each discretized node.

In a highly preferred variant of the inventive method in step (d) and (e) a fast optimization procedure for large-scale finite element discretization problem is carried out whereby:

a stiffness matrix K is assembled, with K·B=J, B is the magnetic field and J is the surface current density,
  the stiffness matrix K is decomposed, whereby the stiffness matrix K is left unchanged,
  decomposed matrices are saved at the beginning of the optimization procedure
  in order to calculate the magnetic field and sensitivity, the saved decomposed matrix is used for fast back-substitution.

Thus the design of the gradient coils can be carried out up to 100 times faster than with the methods known from the state of the art.

Preferably the coil is divided and closed inside the design domain. The optimal layout of a closed coil is divided by several coils by using constraint which is similar to the closed-coil constraints. Thereby the inventive design method can limit the allowed coil topology by adding closed coil constraint.

In order to achieve larger gradient fields it is advantageous to design multiple coils simultaneously on different type surfaces, such as cylinder, planar and irregular surface.

For reconstruction of the discretized coil, the following steps are carried out in a preferred variant of the inventive method:

Mesh the design surface so that the boundary or any predefined closed curve are coincide with the edges of the Lagrange element,
  Specify the zero initial value zero for the whole design surface,
  Implement sensitivity analysis and smooth the sensitivity if there is obvious oscillation,
  Specify the value of the sensitivity on the boundary points as the same value, in particular by using the average value of all the sensitivity on the open boundary or closed curve.

In contrast to the state of the art where closed coils are designed by limiting the value of the stream function, the inventive method uses the limitation of the sensitivity.

Since the main target is to achieve a linear gradient field, it is preferred that the objectives comprise the user specified spatial distribution of the magnetic field as a main objective.

It can be further advantageous if the objectives comprise at least one of the following as an auxiliary objective: the value of the stream function surface, the thermal energy expression, the deformation energy expression, the magnetic energy, and the surface current density value of the coil. Thus the gradient coil can be further improved with respect of the above mentioned parameters. The implementation of multiple objectives is possible without changing the inventive optimization procedure.

BRIEF DESCRIPTION OF THE DRAWING

FIG. 4b shows the corresponding contour lines to the stream function surface of FIG. 4a.

DESCRIPTION OF THE PREFERRED EMBODIMENT

Design Variables for Coil Topology Optimization

Figure 1:
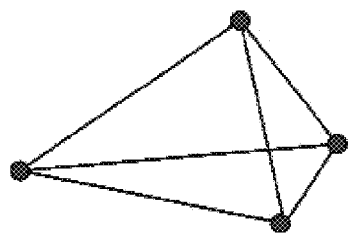
FIG. 1 shows a 3D linear nodal finite element.

In order to design a novel MRI gradient coil, one needs a more advanced optimization technique which can flexible express the topology of a coil. In this section the scalar design variable is discussed in order to design the novel MRI gradient coils on a general surface.

At the same time, the vector J should be divergence free ($\nabla \cdot J = 0$) based on the Maxwell equations. If one chooses the current density $J_x$, $J_y$ and $J_z$ as the design variable directly, the divergence free condition has to be implemented as an additional equality constraint into the coil design optimization model. This equality constraint may not be easily implemented because it relates with PDE solution of the magnetostatics.

Consider a vector field J on the design domain $\Omega$ such that ($\nabla \cdot J = 0$). If the design domain $\Omega$ is simply connected, or if every closed curve in $\Omega$ can be shrunk to a point in a continuous way, it is known that there is a scalar function $\psi$ such that the surface current can be expressed using a scalar function as $$J = \nabla \psi \times \vec{n} \qquad (1)$$

where $\vec{n}$ is the normal vector of the surface with the surface current distribution. The scalar function $\psi$ is known in the MRI coil design as the stream function [12]. The scalar stream function $\psi$ is interpolated using the linear Lagrangian element which belongs to the standard nodal finite element.

3D Magnetostatic Field Simulation Using Least-Square FEM

The differential form of the original Maxwell equations has the first-order differential operator and the magnetic field B is the main unknown for a specified computational domain with suitable boundary conditions. For the standard Galerkin method the second-order elliptical equation can be solved accurately. In order to solve the Maxwell equation using the standard Galerkin discretization, the so-called magnetic potential A is used to transform the first-order static Maxwell equation to the elliptical case. For the optimization of the MRI gradient coil, one is interested in the magnetic field B instead of the magnetic potential A. Therefore it is better if one can solve B directly. Least-square finite element method (LSFEM) in [13] is defined through the minimization of a least-square functional which are not present in standard Galerkin discretization. For the first-order elliptic equation, the use of least-square principle leads to symmetric and positive definite algebraic problems. Because there is no material discontinuity for the gradient coil design, the LSFEM can solve the magnetic field with the divergence free condition directly using the standard nodal type Lagrangian finite element. In this section, the discretization of the magnetostatic problem using the LSFEM is discussed.

Magnetostatic Model Problem in MRI

Figure 2:
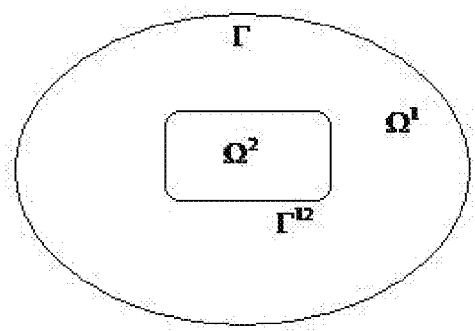
FIG. 2 shows the computational domain for the LSFEM.

Magnetostatics is the study of static magnetic fields in which the currents are stationary or do not alternate directly. When solving the distribution of the magnetic field which is generated by a MRI gradient coil, the magnetostatic problem only has the surface currents distribution without any material interface. In this case, the Maxwell equation can be simplified by assuming that there is no electrostatic charge, no electric field, and the magnetic field is constant with respect to time $$\nabla \times \mu_O^{-1} \vec{B} = J \text{ in } \Omega^1 \text{ and } \Omega^2$$

$$\nabla \cdot \vec{B} = 0 \text{ in } \Omega^1 \text{ and } \Omega^2 \quad (2)$$

where $\vec{B}$ is the magnetic flux density, J is the volume current density and $\mu_O$ is the magnetic constant. The boundary and interface conditions are as follows (FIG. 2)

$$\vec{B} \cdot \vec{n} = 0 \text{ on } \Gamma$$

$$[\mu_O^{-1} B \times \vec{n}] = J_s \text{ on } \Gamma^{12}$$

$$[\vec{B} \cdot \vec{n}] = 0 \text{ on } \Gamma^{12} \quad (3)$$

where $\vec{n}$ is the exterior unit normal on the boundary $\Gamma$ and a fixed unit normal on the interior interface $\Gamma^{12}$, $J_s$ is the surface current density and $[u(x)] := \lim_{s \to O} u(x - s\vec{n}) - u(x - s\vec{n})$ with $x \in \Gamma^{12}$, denotes the jump of u across the interface $\Gamma^{12}$.

The Least-Square Finite Element Method

Here, the least-square finite element method is employed to solve the magnetostatic problem (equation 2). A least-squares functional in Least-squares finite element method is defined to be the sum of the squares of norms of residuals of the differential equations and the corresponding boundary conditions $$I(B) = \sum_{i=1}^{2} \left( \left\| \mu_O (\nabla \times (\mu_O^{-1} \vec{B}) - J) \right\|_{\Omega^i}^2 + \left\| \nabla \cdot \vec{B} \right\|_{\Omega^i}^2 \right) + \quad (4)$$

$$\left\| h^{-1/2} \mu_O [\mu_O^{-1} \vec{B} \times \vec{n} - J_s] \right\|_{\Gamma^{12}}^2 + \left\| h^{-1/2} [\vec{B} \cdot \vec{n}] \right\|_{\Gamma^{12}}^2 + \left\| h^{-1/2} [\vec{B} \cdot \vec{n}] \right\|_{\Gamma}^1$$

where h is the size of mesh, $\|u\|$ means the $L^2$ norm of function u. A necessary condition to the minimal problem above is $$\lim_{t \to O} \frac{\partial}{\partial t} (\vec{B} + t\vec{\tilde{B}}) = 0.$$

This condition results in the following variational problem: find $\vec{B} \in V$ such that $a(\vec{B}, \vec{\tilde{B}}) = l(\vec{\tilde{B}})$ for all $\vec{\tilde{B}} \in V$, where $$a(\vec{B}, \vec{\tilde{B}}) = \sum_{i=1}^{2} \left( (\nabla \times \vec{B}, \nabla \times \vec{\tilde{B}})_{\Omega^i} + \left\| (\nabla \cdot \vec{B}, \nabla \cdot \vec{\tilde{B}})_{\Omega^i} \right\| \right) + \quad (5)$$

$$h^{-1}([\vec{B} \times \vec{n}], \vec{\tilde{B}} \times \vec{n}) \left\| \Gamma^{12} + h^{-1}([\vec{B} \cdot \vec{n}], \vec{\tilde{B}} \cdot \vec{n}) \right\| \Gamma,$$

$$l(\vec{\tilde{B}}) = \sum_{i=1}^{2} (\mu_O J, \nabla \times \vec{\tilde{B}})_{\Omega^i} + h^{-1}(J, \vec{\tilde{B}} \times \vec{n}) \| \Gamma^{12}.$$

Let $V_h$ be the finite element spaces of V, the least-squares finite element method means to find a numerical solution $\vec{B}_h \in V_h$ such that $a(\vec{B}, \vec{\tilde{B}}) = l(\vec{\tilde{B}})$ for all $\vec{\tilde{B}}_h \in V_h$.

Speedup Optimization Procedure Using Factorization

One of the main reasons that the target field method (TFM) is still the dominated method for designing the MRI gradient coil is that its design procedure merely needs to solve one linear algebra equation, even though this equation is ill-posed and the regularization method is needed to maintain the accuracy of the numerical solution. When the finite element method (FEM) is used to implement the design of a MRI gradient coil, the biggest challenge is the extremely expensive computational cost for the forward and sensitivity analysis, because the three dimensional finite element analysis usually has the discretized matrix with dimension of several hundreds thousand degrees of freedom. Considering the numerical optimization may take several hundreds iterations, the whole optimization procedure for a full three dimensional coil design could take more than one day or longer even using the latest powerful personal computer with multi-core CPU and more than 12 gigabyte memory. In author's opinion, this is the usual argument one has to face when the FEM instead of TFM is used to design MRI gradient coil. However, it deserves to mention that in most cases the target field method is merely suitable to design a gradient coil on a regular surface and the target magnetic field is defined using the limited polynomial terms. In order to design a completely novel gradient coil which locates on a general surface and the target field cannot be expressed using the finite polynomial terms, the numerical optimization method is still a powerful alternative to the target field method. In this section, the numerical optimization procedure of the gradient coil design using the FEM is revisited first and then a speedup procedure is proposed based on the characteristic of the surface stream function type design variables.

Optimization Model

The purpose of the gradient coil is to generate a specified magnetic field within the region of interest (ROI). The coil may be positioned in space close to the ROI. Here $\Omega_{ROI}$ is the region of the interest and $\Gamma$ is the three dimensional surface with a surface current (or surface stream function) distribution. The design goal for the MRI gradient coil is to find an optimal current distribution so as to achieve a desired magnetic field $B_z^*$ in $\Omega_{ROI}$ $$\text{Min: } L = \int_{\Omega_{ROI}} (B_z - B_z^*)^2 d\Omega_{ROI} \quad (6)$$

When a scalar design stream function is used as the design variable, the corresponding optimization model with design constraints is:

$$\text{Min: } L(B,\psi) = \int_{\Omega_{ROI}} (B_z - B_z^*)^2 d\Omega_{ROI}$$

$$\text{s.t. } a(\vec{B}, \vec{B'}) = l(\vec{B'}) \quad (7)$$

where the constraint equation is the least-square finite element discretization in equation 5. The standard optimization procedure is shown in FIG. 3 and the numerical iteration is used to update the design variable until the residual of the objective is small enough.

Fast Solving Procedure

Figure 3:
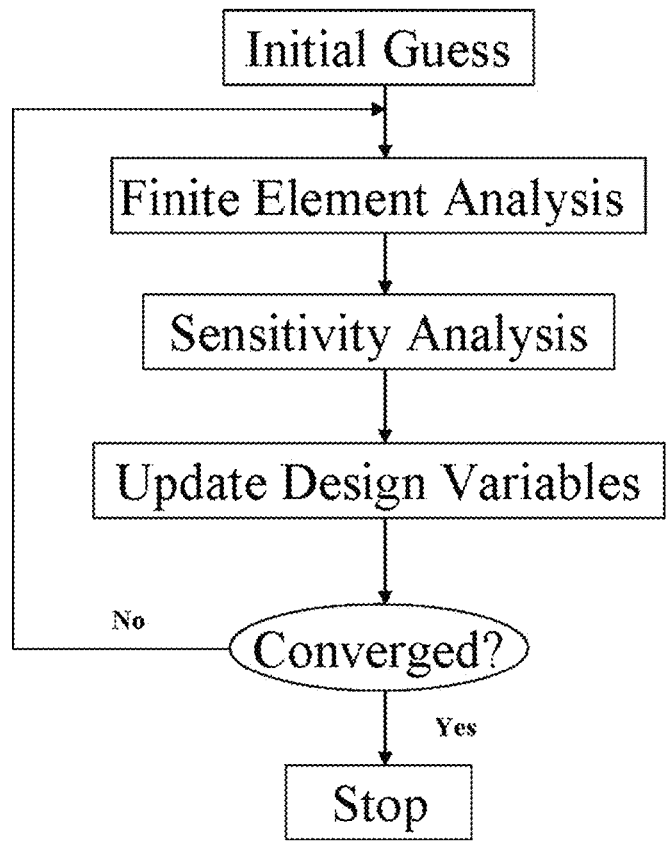
FIG. 3 shows the standard optimization iteration procedure.

From the optimization procedure shown in FIG. 3, the main computational cost for each iteration is the calculation of the unknowns for the forward problem and the adjoint vector for the sensitivity. When the finite element is used to discretize a design domain, the discretized stiffness matrix is kept unchanged if one can organize all terms with the design variable into the source term so that only the vector on the right hand side of the discretized equilibrium equation needs to be updated in each iteration. This is an unique characteristic compared with other optimization in which the design variables are usually located inside of the design domain so that the discretized stiffness matrix has to be updated in each optimization iteration. Based on this point, a fast solver strategy is proposed here to speedup the optimization procedure in which the speed up ratio could be 100 times faster than before.

The discretized global stiffness matrix is symmetrical and positive definite when the scalar stream function is used as the design variable and the Lagrange element is used to interpolate the design variable and discretize the magnetostatic equation in equation 7. One can use the $L^T DL$ decomposition to save the matrices LD and L. One merely needs to assemble the global stiffness matrix and implement the matrix decomposition once using a suitable linear algebra solver. In table 1 the CPU time for the decomposition and the back-substitution steps are listed. It is clear that the back-substitution time merely takes less than 3 percent of the time used for the decomposition. Since the global stiffness matrix is kept unchanged, one can save the decomposed matrices at the beginning of the optimization, and always use the saved decomposed matrices to substitute the solution for the forward problem and the adjoint vector. Another nice property of this method is that the saved matrix can be used for different optimization objectives when the mesh used to discretize the design domain is maintained. Using computer with AMD64 CPU (2-core 2.6 G), one optimization iteration merely takes 2 seconds when the dimension of the global stiffness matrix is about 50,000, and one or two minutes when the dimension of the global stiffness matrix is about 200,000. Based on author's numerical experience, a discretization with 200,000 degrees of freedom is enough for usual gradient coil design. A potential limitation for the strategy suggested here may be the memory used to save the decomposed matrices (see table 1). However, this should not be the bottleneck because the memory and hard disk spaces are not a serious challenge even for a personal computer with 64-bite operation system.

TABLE 1

The CPU time and memory usage for matrix decomposition and substitute

| Dofs (thousand) | 234 | 129 | 55 | 17 |
|---|---|---|---|---|
| Decomposition time (second) | 1676 | 495 | 70 | 6 |
| Substitute time (second) | 3.42 | 1.43 | 0.41 | 0.16 |
| Memory usage (gigabyte) | 6 | 2 | 0.6 | 0.08 |

Numerical Implementation of Coil Design

In order to design a MRI gradient coil using the method proposed in this chapter, there are several details need to be discussed so that the designed coil can be used for real case.

Coil Discretization

The real surface coil should comprise discrete windings with constant current I, instead of a sheet of conductor with continuous current density distribution. A post processing is needed in order to discrete the stream function.

For a surface current J, there is a equivalent expression for the divergence free condition ($\nabla \cdot J = 0$)[12]

$$C_i = \int_C J \cdot (dl \times \vec{n}) = \int_C (\vec{n} \times J) dl = 0 \quad (8)$$

for any closed contour $C_i$ on the stream function surface. This property provides a way to express the discrete coils from a continuous stream function surface. In principle, there are three steps in order to generate the individual windings from a stream function surface:

1. Choose a suitable number N so that $I = (\psi_{max} - \psi_{min})/N$. The value of I is the current which flows through the discrete coil.
2. Using the contour line of the stream function to generate separate loops $C_i$. The individual value of the $i$th contour line is $\psi_{min} + I/2 + iI$ where $i = \{1, \ldots, N\}$.
3. Assign the width H of the conductor and extend H/2 distance along the normal direction to both sides of the contour line. The constraint of the conductor width H should be such that any two individual conductors do not intersect each other.

Figure 4A:
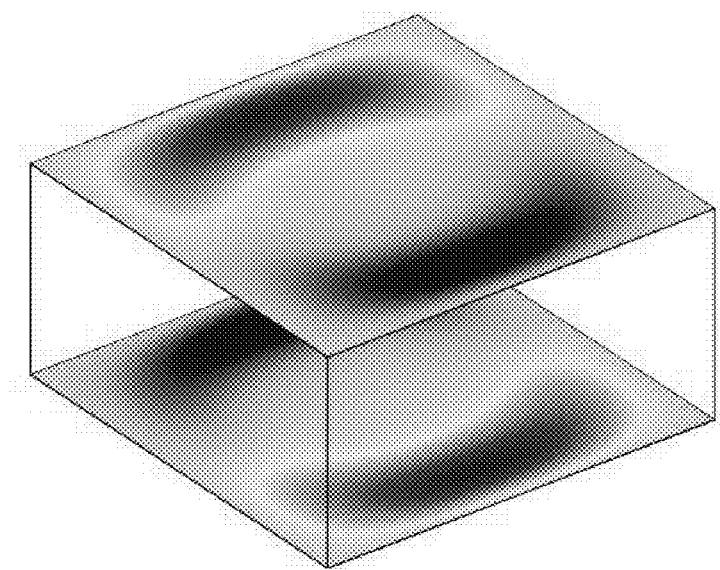
FIG. 4a shows the stream function surface for the biplanar Gx gradient coil.
Figure 4B:
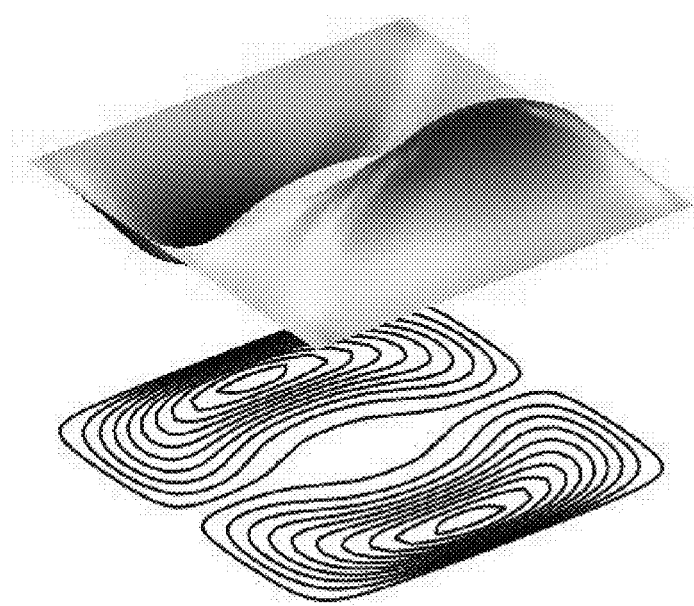

For all the examples presented in this chapter, merely the contour line from the second step is used to illustrate the layout of the gradient coils (see FIG. 4).

Open Vs. Closed Coil

Usually a closed coil with limited length is preferred rather than a coil with open part. The opened coil is hard to fabricate because the round-back conductor which should be far away from the main gradient coil needs to be re-designed. Therefore it is better if a design constraint can limit the layout of the coil directly. Considering the discretization methodology, a closed coil means that the stream function has the same value on the boundary of the design surface, or any closed curve which prefers to have a closed coil. When the scalar stream function is used the surface current will not automatically flow along the boundary or any closed curve. The strategy used in this chapter as follows:

1. Mesh the design surface so that the boundary or any pre-defined closed curve coincide with the edges of the Lagrange element
2. Specify the zero initial value for the whole design surface
3. Implement sensitivity analysis and smooth the sensitivity if there is obvious oscillation 4. Specify the value of the sensitivity on the boundary points as the same value. This could be implemented using the average value of all the sensitivity on the open boundary or closed curve.

Figure 5A:
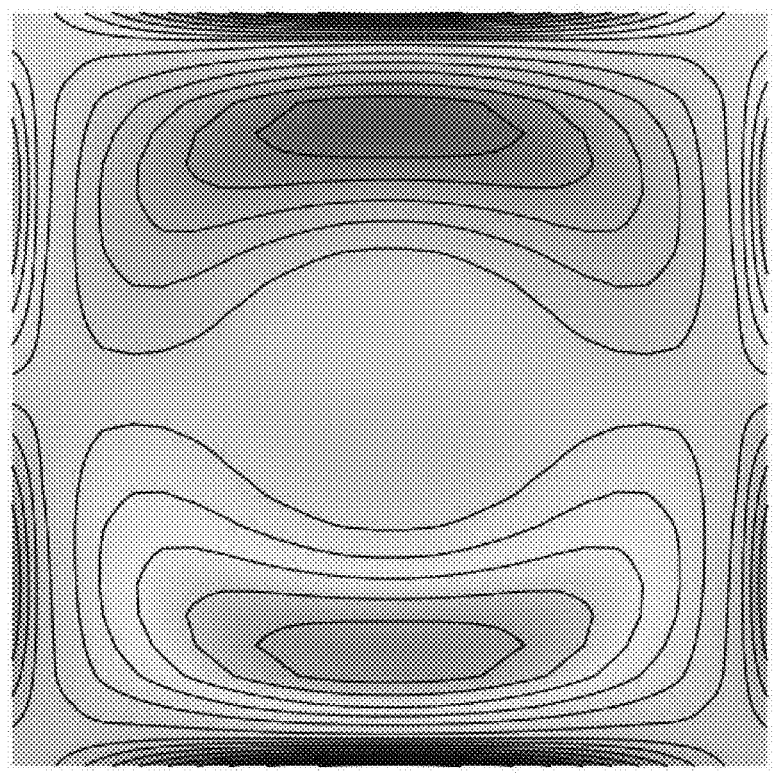
FIG. 5a shows the stream function surface with open coils for biplanar Gx gradient coil.
Figure 5B:
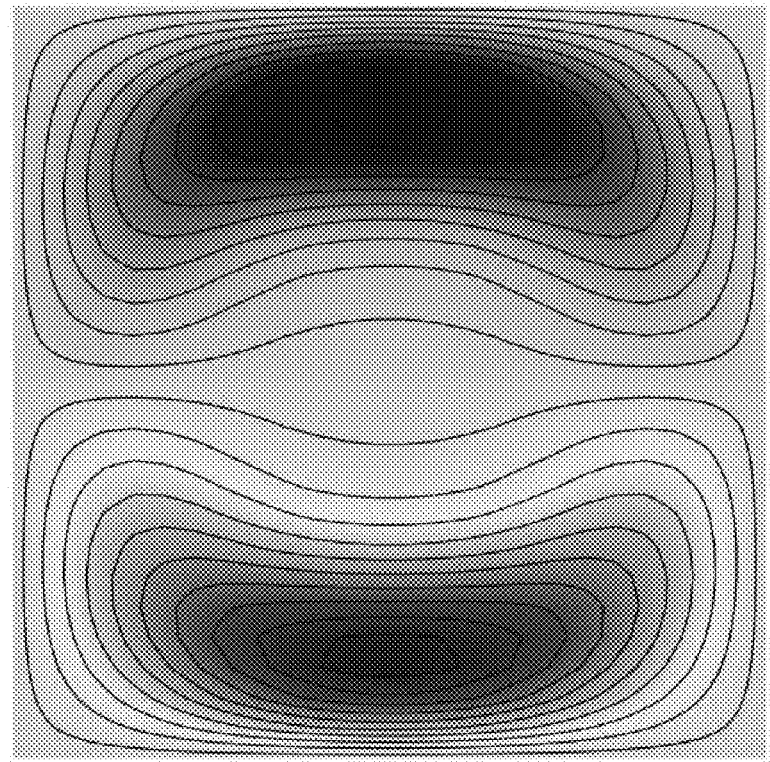
FIG. 5b shows the stream function surface with closed coils for biplanar Gx gradient coil.

Using above procedure, the value of the stream function is maintained as constant during the whole optimization procedure, and the closed type conductor is guaranteed. FIG. 5 shows an example for the bi-planar linear $G_x$ coil design for open and closed cases.

Gradient Coil Design on General Surfaces
Optimization Objective

For the MRI gradient coil design, the typical objective is the specified spacial gradient of the magnetic field. When the numerical optimization method is used, there are two choices for the expression of the optimization objective. The first choice uses the ideal magnetic field as the objective (equation 6) and the second choice uses the spacial derivative of the ideal magnetic field $$\text{Min: } L = \int_{\Omega_{ROI}} \left( \frac{\partial B_z}{\partial x} - B_{zx}^* \right)^2 d\Omega_{ROI} \qquad (9)$$

where $B^*_{zx}$ is the first spacial derivative of the magnetic field $B^*_z$ on the x direction. From the analytical expression point of view, there is no difference between these two choices in the case that $B_z$ is a smooth function. However, the numerical accuracy of the magnetic field $B_z$ may be different for the different discretization choices. For the standard finite element discretization the magnetic potential is used as the unknowns for the discretized magnetostatic equations, the magnetic field $B_z$ is calculated as the first order derivative of the magnetic potential A, which means that the accuracy of the magnetic field $B_z$ is one order less than the magnetic potential A. At the same time, it may not easy to calculate the $\partial B_z/\partial x$ when the linear element is used to calculate the magnetic potential A. When the magnetic field $\vec{B}$ is used as the unknowns for the discretized least-square finite element equations, the magnetic field $B_z$ is calculated directly as the unknowns. When the magnetic field B is discretized using the linear element, the $\partial B_z/\partial_x$ still is manageable for the sensitivity analysis without losing the accuracy too much. Therefore both objectives (equation 7 and 9) work for the case that the magnetic field $\vec{B}$ is used as unknowns for the finite element discretization.

Figure 6:
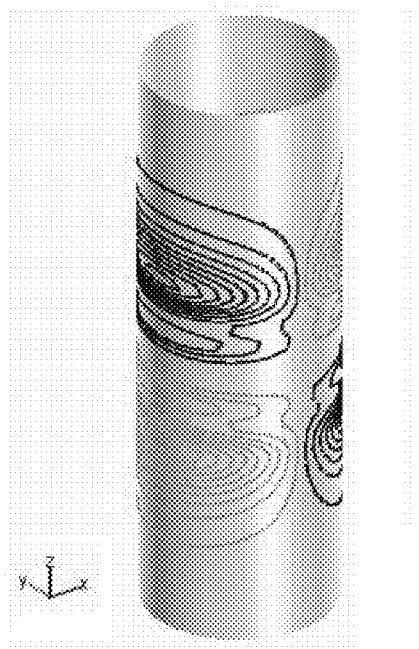
FIG. 6 shows the cylinder Gx gradient coil using the objective in equation 6.
Figure 7:
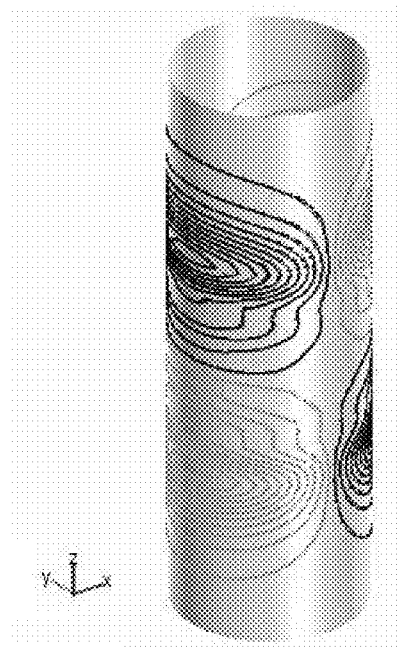
FIG. 7 shows the cylinder Gx gradient coil using the objective in equation 9.

FIGS. 6 and 7 show the $G_x$ gradient coil design using the least-square finite element discretization. FIG. 6 shows the result using the equation 7 as the objective and FIG. 7 shows the result using the equation 9 as the objective. The layouts of the coils are quite similar to each other. However, the relative error between $\partial B_z/\partial x$ and $B^*_{zx}$ inside the ROI shows a big difference.

The maximum residual in FIG. 7 is 3 percent which is lower than the industry standard (5 percent) so that the quality of the MRI imaging obtained using the designed gradient coil is guaranteed. For the coil in FIG. 6, the maximum relative error is more than 30 percent which definitely needs to be improved further.

Sensitivity Analysis

Figure 8:
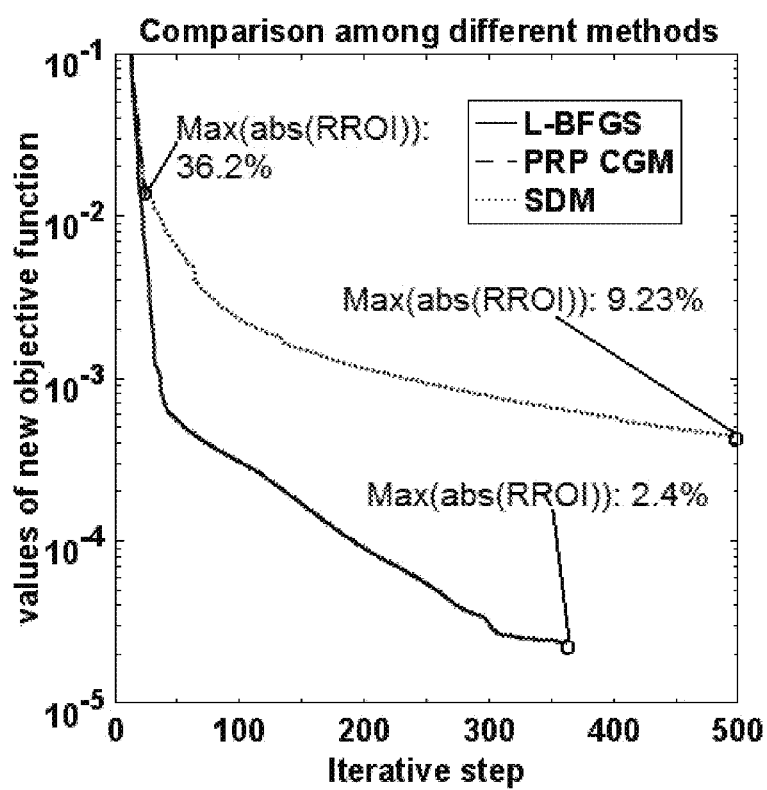
FIG. 8 shows the convergence history for the cylinder Gx gradient coil design, where RROI is the residual of the objective in the region of interest.

The sensitivity vector is obtained using the first-order derivative of the objective. The simplest method to update the design variables is the steepest descent (SD) method in which the first-order derivative of the objective is used directly with the adaptive step size searching algorithm. Even though its simplicity, the performance of this method is limited by the smoothness of the objective. At the same time, the convergence rate is very slow when the optimization is close to the optimal point. Another method which is called conjugate gradient (CG) method can avoid the drawback of the steepest descent method. In principle, the conjugate gradient algorithm includes two basic steps: adding an orthogonal vector to the steepest descent direction, and then move them in another direction nearly perpendicular to this vector. For energy type objective, the conjugate gradient method is very efficient. However, the numerical stability of the CG is not as good as the SD method. Therefore, it is better to take the direction closest to the residual of the gradient compared with the last iteration under the conjugate constraint. FIG. 8 shows the convergent history for the layout design of linear $G_x$ cylinder coil. It is clear that the CG has much better performance than the SD method.

In principle, both the SD and CG methods belong to the first order method. When an initial guess is far away from the optimal, the first order method has more stable performance than the Newton type method. However, the Newton type method has super-linear convergence when the optimization iteration is close to the optimal. This property makes the Newton method more attractive than the first order method. For the large-scale optimization problem, the biggest challenge for the Newton method is that the Hessian matrix is very expensive to update, or even not available. Therefore, a lot of pseudo-newton type methods have been proposed. The Limited memory BFGS (LBFGS) method [15] is the one of pseudo-Newton method which was designed for large scale applications in which the Hessian matrix is not available. Since there is no constraint for the typical gradient coil design, the LBFGS is a better choice than other pseudo Newton methods. FIG. 8 shows the convergent history which shows that LBFGS has the best performance among these three methods. Therefore the LBFGS is used as the default method if there is no constraint for design variables.

Multi-Layer Surfaces Coil

Figure 9:
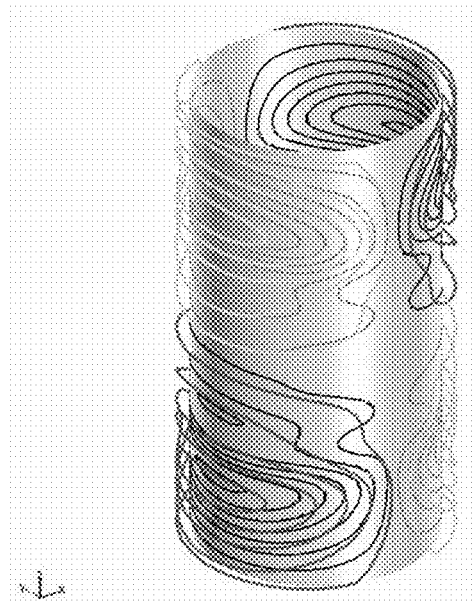
FIG. 9 shows the design of the Gx gradient coil using two cylinder surface coils.
Figure 10:
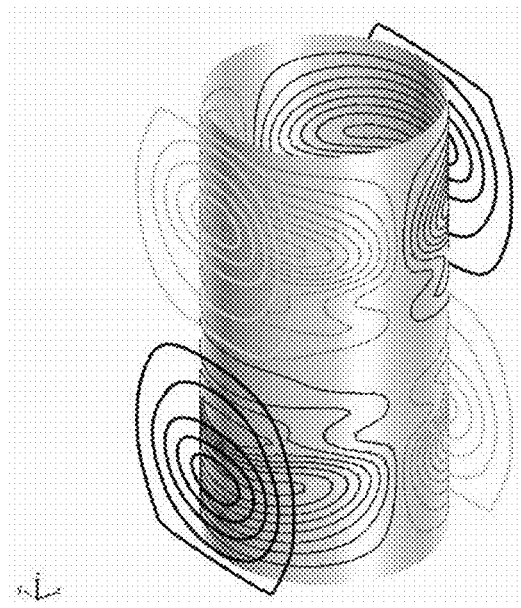
FIG. 10 shows the design of the Gx gradient coil using one cylinder surface coil and one planar coil.

In the design of MRI gradient coil, multi-layer approach [16] [17] can achieve larger gradients than single-layer method at a given resistance and power dissipation. The current numerical optimization method can be easily extended to the multiple-layer gradient coils design. The only difference with the single layer coil design is that the design variables are located on two different design surfaces. When one meshes the design domain in which the design surfaces coincide with the mesh edge, then one can specify the current on these design surface directly. Compared with the single layer coil design, the computational cost for the forward analysis and the sensitivity is the same for the multiple layer case, when the number of the degrees of freedom used to discretize the computational domain is the same. This is different with the analytical optimization method in which the complexity increases with the number of the design variables and the number of the coil layers. FIG. 9 shows the design of the cylinder $G_x$ gradient coils on two cylinder surfaces with different radius. Since finite element method can deal with any shaped design domain using the piecewise discretization methodology, the design spaces do not necessarily maintain the same shape. FIG. 10 shows the design of the cylinder $G_x$ gradient coils on two different kinds of surfaces, one in the cylinder surface and the other in the planar surface.

Multi-Objective Optimization of Gradient Coil

For the typical MRI gradient coil design, the objective includes not only the target magnetic field, but also other physical quantities which need to be minimized or maximized. The most used quantities include the inductance, magnetic energy and the mechanical torque. The main reason that the inductance or magnetic energy is defined as part of the objective is that the direction of the gradient magnetic field should be switched rapidly, and the switching time depends on the ratio of the coil inductance and the resistance. For the analytical method, the formulation and calculation of the coil inductance is quite complicated, the stored magnetic energy, which is related with the inductance indirectly, is used to replace the conductance as the objective.

Instead of the coil inductance or magnetic energy, the additional optimization objective which is chosen is the value of the stream function and the gradient of the stream function. This does not mean that the coil induction is not important. Based on our limited numerical experience, the Joule heating is also a big problem to which not enough attention is paid. At the same time, the length of the coil which is also related with the coil inductance can be controlled by smoothing the layout of the stream function. Therefore the inductance is considered indirectly when the value of the stream function is used as part of the optimization objective.

Torque balanced coil has the advantage that the electromagnetic force generated by the current can cause the movement of the gradient coil. Therefore the coil should be well restrained or designed to eliminate the torques. Even though the torque could be balanced, it does not mean that the electromagnetic force that acts on the coil is minimized. The coil may still show deformation because of the electromagnetic force. Therefore, the stress minimization need also be considered. The torque is not considered here because it is automatically balanced for most of the symmetrical gradient coils illustrated here.

Limit Thermal Source and Current Density

Here the Joule heating is an example to choose a suitable objective except for the magnetic field distribution. In Joule heating, the temperature increases due to the resistive heating from the electric current J. The generated resistive heat Q is proportional to the square of the magnitude of the electric current density. Based on the strategy used to discretize the coil, the difference between $\psi_{max}$ and $\psi_{min}$ will decide the current value flow through the discrete coil if the number of the discrete coils N is fixed. When the scalar stream function is used to express the surface current density, J is related with the first derivative of the stream function $\psi$. Based on above analysis, there are two simple choices when the Joule heating is considered as part of the objective $$\text{Min: } L = \int_{\Omega_{ROI}} \alpha \left( \frac{\partial B_z}{\partial x} - B_{zx}^* \right)^2 d\Omega_{ROI} + \int_\Gamma \beta \psi^2 d\Gamma \quad (10)$$

Where $\Gamma$ is the design surface where the stream function exists, and $$\text{Min: } L = \int_{\Omega_{ROI}} \alpha \left( \frac{\partial B_z}{\partial x} - B_{zx}^* \right)^2 d\Omega_{ROI} + \int_\Gamma \beta (\nabla \psi)^2 d\Gamma \quad (11)$$

where $\alpha$ and $\beta$ are the weight to balance the two objectives. During the optimization, the sensitivity for the magnetic field distribution and the stream function are calculated separately. Weight factor sweeping can illustrate the minimum point for the multi-objective optimization problem. This design procedure will effectively control the thermal performance of the gradient coil.

Minimize Stress Distribution

Because the main magnetic field $B_0$ (usually from 3 T to 11 T) along the z-axis has much larger value than the magnetic field generated by the gradient coil (usually from 20 mT to 100 mT), the magnetic force acts on the gradient coil merely related with $B_0$ and surface current density J. Considering the thickness of the coil is very small compared with the dimension of the MRI scanner, the computed model can be simplified as the force acts on the shell or plate. The stress minimization optimization can be categorized as the compliance minimization topology optimization problem. The optimization model is $$\text{Min: } L = \int_{\Omega_{ROI}} \alpha \left( \frac{\partial B_z}{\partial x} - B_{zx}^* \right)^2 d\Omega_{ROI} + \int_\Gamma \beta \epsilon^T D \epsilon d\Gamma \quad (12)$$

where $\epsilon$ is the strain vector and D is the material matrix. Because the magnetic field distribution is still the major task of the optimization, the weight parameter $\beta$ should be smaller than $\alpha$ if the initial values for these two objectives are normalized. Therefore the basic layout of the gradient coil is still similar to the single objective case, whereas the stress distribution is controlled by the second objective in the case that the distribution of the magnetic field is controlled in certain residual range.

REFERENCES

[1] P. C. Lauterbur, "Image Formation by Induced Local Interactions: Examples of Employing Nuclear Magnetic Resonance", *Nature* 242, 190491, 1973.
[2] R. Turner, "A target field approach to optimal coil design", *J. Phys. D: Appl. Phys.* 19 147451, 1986.
[3] R. Turner, "Minimum inductance coils", *J. Phys. E: Sci Instrum* 21, 948-952, 1988.
[4] R. Turner, "Gradient coil design: A review of methods", *Magn. Reson. Imaging* 11, 903-920, 1993.
[5] L. K. Forbes and S. Crozier, "Novel Target-Field Method for Designing Shielded Biplanar Shim and Gradient Coils", *IEEE Trans. Magn.*, Vol. 40, no. 4, 1929-1938, 2004.
[6] L. K. Forbes, M. A. Brideson and S. Crozier, "A target-field method to design circular biplanar coils for asymmetric shim and gradient fields", *IEEE Trans. Magn.*, Vol. 41, no. 6, 2134-2144, 2005.
[7] W. Liu, D. Zu, X. Tang and II. Guo, "Target-field method for MRI biplanar gradient coil design". *J. Phys.* 1): *Appl. Phys.* 40 4418-4424(7), 2007.
[8] M. Engelsberg, Ricardo E de Souza and Carlos M Dias Pazos, "The limitations of a target field approach to coil design". *J. Phys. D: Appl. Phys.* 21 1062-1066, 1988.
[9] F. Shi and R. Ludwig, "Magnetic resonance imaging gradient coil design by combining optimization techniques with the finite element method. *IEEE Trans. Magn.*, Vol. 34, no. 3, 671-683, 1998.
[10] M. Poole and R. Bowtell, "Novel gradient coils designed using a boundary element method". *Concepts Magn. Reson. Part B,* 31B:162-175, 2007.
[11] L. Marin, H. Power, R. W. Bowtell, C. C. Sanchez, A. A. Becker, P. Glover, A. Jones, "Boundary element method for an inverse problem in magnetic resonance imaging gradient coils". *CMES-Comp. Model. Eng. Sci.,* 23:149-173, 2008.

[12] G. N. Peeren, "Stream function approach for determining optimal surface currents". *J. Comput. Phys.*, Vol. 191, no. 1, 305-321, 2003.

[13] B. Jiang, *The least squares finite element, method: theory and applications in computational fluid dynamics and electromagnetics*, Springer-Verlag, 1998.

[14] J. M. Jin, *The Finite Element Method in Electromagnetics* (2nd Edition). New York: John Wiley & Sons, 2002.

[15] D. C. Liu and J. Nocedal, "On the limited memory BFGS method for large scale optimization methods", *Mathematical Programming* 45, 503-528, 1989.

[16] R. Bowtell and P. Robyr, "Multilayer Gradient Coil Design"; *J. Magn. Reson.*, 131,286-291, 1998

[17] J. Leggett, S. Crozier, S. Blackband, B. Beck and R. W. Bowtell, "Multilayer transverse gradient coil design", *Concepts Magn. Reson. B* 16, 38C46 2003.

[18] M. P. Bendsoe; O. Sigmund, *Topology Optimization Theory, Methods* and *Applications*, Springer, 2003.

We claim:

1. A method for designing and constructing an electromagnetic gradient coil for magnetic resonance imaging systems, the method comprising the steps of:
   a) choosing a set of objectives $L_i$, wherein the objectives $L_i$ are combined to one weighted-sum objective function L;
   b) choosing a design variable ψ for modifying a magnitude of the objective function L;
   c) making an initial estimate of the value of the design variable ψ;
   d) simulating a magnetic field in a computational domain with respect to a distribution of surface current density using a least square finite element analysis;
   e) carrying out a sensitivity analysis by calculating a sensitivity vector $G=\partial L/\partial \psi$;
   f) updating the design variable ψ, wherein a value of the design variable ψ is changed in order to decrease the magnitude of the objective function;
   g) determining whether convergency is achieved by either determining whether the magnitude of the objective function does not decrease or whether the Euclidian norm of the sensitivity vector G is approximately zero;
   h) repeating a) to g) until convergency is achieved;
   i) determining, following steps a) to h), shapes and positions of discrete current paths in the designed gradient coil; and
   j) constructing, following steps a) to i), the gradient coil.

2. The method of claim 1, wherein the design variable ψ is a scalar stream function.

3. The method of claim 2, wherein steps c), e) and f) comprise the steps of meshing a design surface so that a boundary or any pre-defined closed curve coincides with edges of a Lagrange element, specifying an initial value of zero for an entire design surface, implementing sensitivity analysis and smoothing a sensitivity if there is oscillation, and specifying a value of the sensitivity on boundary points as a same value.

4. The method of claim 1, wherein the value of the sensitivity on the boundary points is specified using an average value of all sensitivities on an open boundary or closed curve.

5. The method of claim 1, wherein, in steps d) and e), an optimization procedure for a large-scale finite element discretization problem is carried out, the procedure comprising the steps of assembling a stiffness matrix K, with K·B=J, wherein B is a magnetic field and J is a surface current density, decomposing the stiffness matrix K, wherein the stiffness matrix K is left unchanged, saving decomposed matrices at a beginning of the optimization procedure, and using a saved decomposed matrix for fast back-substitution to calculate a magnetic field and sensitivity.

6. The method of claim 1, wherein the coil is divided and closed inside a design domain Ω.

7. The method of claim 1, wherein multiple coils are designed simultaneously on different type surfaces.

8. The method of claim 7, wherein the different type surfaces comprise at least one of a cylinder, a planar and an irregular surface.

9. The method of claim 1, wherein the objective comprises a user specified spatial distribution of a magnetic field as a main objective.

10. The method of claim 1, wherein the objective comprises at least one of the following as an auxiliary objective: a value of a stream function surface, a thermal energy expression, a deformation energy expression, a magnetic energy, and a surface current density value of the coil.

11. The method of claim 3, wherein, in steps d) and e), a fast optimization procedure for a large-scale finite element discretization, problem is carried out, the procedure comprising the steps of assembling a stiffness matrix K, with K·B=J, wherein B is a magnetic field and J is a surface current density, decomposing the stiffness matrix K, wherein the stiffness matrix K is left unchanged, saving decomposed matrices at a beginning of the optimization procedure, and using a saved decomposed matrix for fast back-substitution to calculate a magnetic field and sensitivity.

12. The method of claim 3, wherein the coil is divided and closed inside a design domain Ω.

13. The method of claim 5, wherein the coil is divided and closed inside a design domain Ω.

14. The method of claim 3, wherein multiple coils are designed simultaneously on different type surfaces.

15. The method of claim 5, wherein multiple coils are designed simultaneously on different type surfaces.

16. The method of claim 6, wherein multiple coils are designed simultaneously on different type surfaces.

17. The method of claim 11, wherein multiple coils are designed simultaneously on different type surfaces.

18. The method of claim 3, wherein the objective comprises a user specified spatial distribution of a magnetic field as a main objective.

19. The method of claim 5, wherein the objective comprises a user specified spatial distribution of a magnetic field as a main objective.

20. The method of claim 11, wherein the objective comprises a user specified spatial distribution of a magnetic field as a main objective.

21. The method of claim 3, wherein the objective comprises at least one of the following as an auxiliary objective: a value of a stream function surface, a thermal energy expression, a deformation energy expression, a magnetic energy, and a surface current density value of the coil.

22. The method of claim 5, wherein the objective comprises at least one of the following as an auxiliary objective: a value of a stream function surface, a thermal energy expression, a deformation energy expression, a magnetic energy, and a surface current density value of the coil.

* * * * *

UNITED STATES PATENT AND TRADEMARK OFFICE
CERTIFICATE OF CORRECTION

| | | |
|---|---|---|
| PATENT NO. | : 8,560,278 B2 | Page 1 of 1 |
| APPLICATION NO. | : 12/662387 | |
| DATED | : October 15, 2013 | |
| INVENTOR(S) | : Zhenyu Liu et al. | |

It is certified that error appears in the above-identified patent and that said Letters Patent is hereby corrected as shown below:

Title Page, item (54) and in the Specification, Col. 1, line 1, please correct the title as follows:

-- DESIGN OF MRI GRADIENT COIL --.

Signed and Sealed this
Eleventh Day of February, 2014

Michelle K. Lee
*Deputy Director of the United States Patent and Trademark Office*